United States Patent [19]

Funada et al.

[11] Patent Number: 5,372,872
[45] Date of Patent: Dec. 13, 1994

[54] MULTILAYER PRINTED CIRCUIT BOARD

[75] Inventors: Yoshitsugu Funada; Koji Matsui, both of Tokyo, Japan

[73] Assignee: NEC Corporation, Tokyo, Japan

[21] Appl. No.: 160,353

[22] Filed: Nov. 29, 1993

[30] Foreign Application Priority Data

Dec. 9, 1992 [JP] Japan ................. 4-329047

[51] Int. Cl.$^5$ ............................................. B32B 9/00
[52] U.S. Cl. .................................. 428/210; 428/256; 428/255; 428/416
[58] Field of Search ............... 428/210, 256, 255, 416

[56] References Cited

U.S. PATENT DOCUMENTS

| | | | |
|---|---|---|---|
| 3,258,387 | 6/1966 | Brown et al. | 428/209 |
| 4,170,675 | 10/1979 | Greengrass | 428/256 |
| 4,358,474 | 11/1982 | Nakano et al. | 428/209 |
| 4,427,482 | 1/1984 | Yamada et al. | 428/255 |
| 4,448,838 | 5/1984 | McClenahan et al. | 428/256 |
| 4,550,051 | 10/1985 | Spielau et al. | 428/416 |
| 4,559,248 | 12/1985 | Sumiyoshi et al. | 428/256 |
| 4,902,556 | 2/1990 | Benedikt et al. | 428/209 |
| 4,923,735 | 5/1990 | Peerlkamp | 428/209 |
| 4,963,425 | 10/1990 | Buchanan et al. | 428/210 |

*Primary Examiner*—Patrick J. Ryan
*Assistant Examiner*—Kam F. Lee
*Attorney, Agent, or Firm*—Young & Thompson

[57] ABSTRACT

A multilayer printed circuit board reducing cross-talk noise between signal interconnection layers and between through-holes for connecting the signal interconnection layers is disclosed. The multilayer printed circuit board has printed substrates each formed thereon an interconnection layer, and prepreg sandwiched therebetween. The prepreg comprises an reinforcement lattice cloth formed of rovings of a electroconductive material maintained at a ground potential and a dielectric resin impregnated thereinto and forming a dielectric solid layer having through-holes penetrating therethrough. The electroconductive reinforcement lattice cloth functions as a ground layer between signal interconnection layers and between through-holes. The rovings may be of a metal or a semiconductive material such as carbon fiber. The multilayer printed circuit board is superior in heat resistance, dimensional stability and mechanical strength.

8 Claims, 3 Drawing Sheets

MULTILAYER PRINTED CIRCUIT BOARD

BACKGROUND OF THE INVENTION (a) Field of the Invention

The present invention relates to a multilayer printed circuit board, and more particularly, to a multilayer printed circuit board capable of reducing generation of cross-talk noise.

(b) Description of the Related Art

Accompanied with a recent progress in electronic technology, a great need has arisen for fabricating electronic equipment of a high speed and a high performance with a light weight as well as a small size. In order to meet such need, a high density interconnection structure should include wires of a smaller width and finer throughholes. However, in case that signal lines are arranged in a long distance or with the space between them being very small, or in case that electronic equipment itself has a high frequency circuit, a considerable noise is generated in the electronic equipment due to the coupling capacity existing between signal lines. It is generally called cross-talk noise which is generated due to interference between signal lines.

In order to avoid such cross-talk noise, a material having a low dielectric constant may be provided between the signal lines, or a short distance may be provided between the signal lines and the ground plane, both of which will be considerably effective. However, the thickness and the dielectric constant of substrates having a printed circuit thereon cannot be well adjusted to have low cross-talk noise. That is, the coupling capacity between the signal lines is not reduced to a satisfactorily low value so that cross-talk due to the mutual interference between the signal lines may be readily induced, resulting in a reduction in operational reliability of the electronic equipment.

FIG. 1 is a cross-sectional view of a conventional multilayer printed circuit board adopted in electronic equipment. In FIG. 1, two signal interconnection layers 5a and 5b are disposed having signal lines in directions perpendicular to each other with a heat resistant dielectric resin substrate 12 sandwiched therebetween. Besides, ground layers 6a and 6b are disposed so as to sandwich the heat resistant dielectric resin substrates 12 as well as the signal interconnection layers 5a and 5b between the ground layers 6a and 6b.

With the multilayer printed circuit board as described above, if the space between the adjacent signal layers 5a and 5b is small, tile cross-talk noise accompanied by the transmitted signal will be large, resulting in a deterioration of the transmitted signals. For improving such disadvantages, such circuit structure is disclosed in Japanese Patent Laid-Open Publication No. 63(1988)-136694 in which the signal interconnection layers and ground layers are disposed alternately in one layer. With the circuit structure disclosed in the publication, however, a large cross-talk noise will be still induced between the signal lines and between the through-holes in a printed circuit board of a higher density construction. As a result, there arises the problem that satisfactory signal transmission cannot be obtained.

An object of the present invention is therefore to provide a multilayer printed circuit board capable of reducing cross-talk noises between interconnection layers and between through-holes electrically connecting the interconnection layers.

DESCRIPTION OF THE PREFERRED EMBODIMENTS

Figure 1:
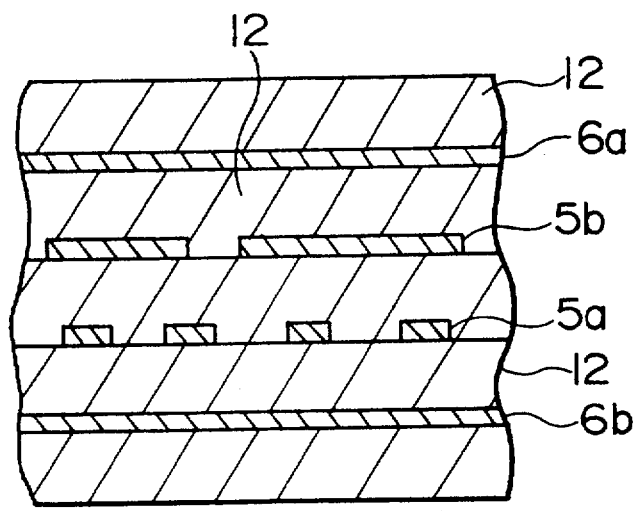
FIG. 1 is a cross-sectional view of a conventional multilayer printed circuit board.
Figure 2:
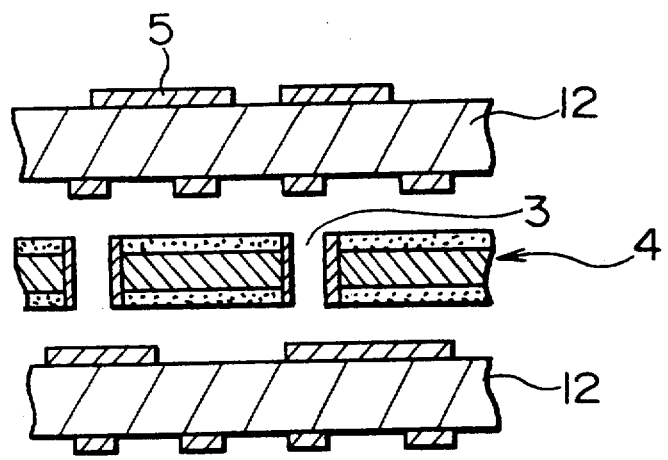
FIG. 2 is a developed cross-sectional view of an embodiment of a multilayer printed circuit board according to the present invention.

A multilayer printed circuit board according to an embodiment of the present invention will be described with reference to the drawings. FIG. 2 is a cross-sectional view of the multilayer printed circuit board, and FIGS. 3A and 3B are a top plan view and a cross-sectional view, respectively, of the prepreg (intermediate substrate) shown in FIG. 2.

A multilayer printed circuit board of this embodiment comprises two heat resistant dielectric resin substrate 12 each having signal interconnection layers 5 disposed on respective both surfaces thereof. A prepreg or intermediate dielectric substrate 4 is sandwiched between both the heat resistant dielectric resin substrates 12 and thermally bonded thereto under the application of heat and pressure, thereby forming a laminated unitary body of the substrates.

Figure 3A:
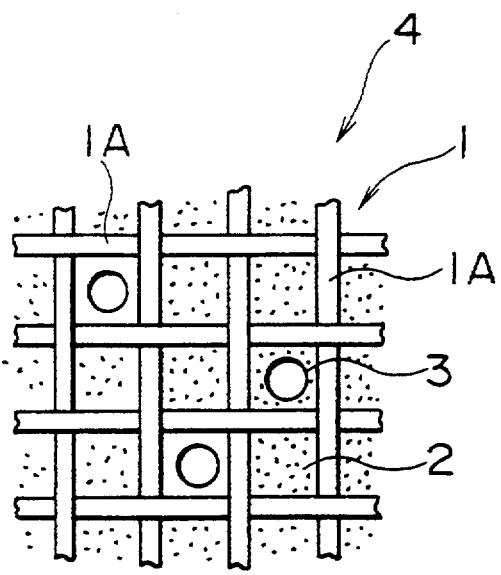
FIGS. 3A and 3B are a top plan view and a cross-sectional view, respectively, of tile prepreg shown in FIG. 2.
Figure 3B:
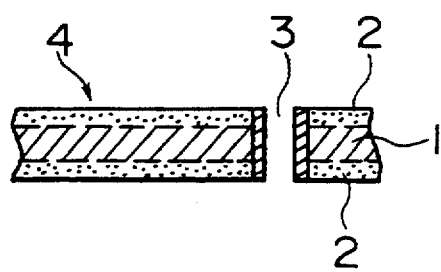

With reference to FIGS. 3A and 3B, the prepreg 4 of a tack-dried or half dried sheet is composed of an electro-conductive reinforcement lattice cloth 1, in which conductive rovings 1A are meshed with each other, and a heat resistant dielectric resin 2 impregnated into the rovings 1A and meshes thereof and covering the lattice cloth 1. The rovings 1A are composed of several fibers of a conductive material maintained at a ground potential or a certain potential. The prepreg 4 has through-holes 3 penetrating through the heat resistant dielectric resin layer 2 and disposed within the meshes of the reinforcement lattice cloth 1, the through-holes 3 connecting the signal interconnection layers 5 formed on the heat resistant dielectric resin substrate 12 as shown in FIG. 2.

As to the material of the heat resistant dielectric resin 2 to be used for forming the prepreg 4 and the heat resistant dielectric resin substrate 12, any thermosetting resin may be employed, provided that it has a thermal deformation temperature of 200° C. or above (in conformity with ASTMD648).

For example, the preferable dielectric materials for the prepreg 4 and the substrates 12 include some polyimide, diallyl isophthalate, and epoxy resins. Such a polyimide resin of condensation type is not preferable that is produced through a process in which condensed water is accompanied by an imidizing reaction upon pressing under the application of heat. A polyimide can be preferably employed if it is produced through a process in which condensed water is not accompanied by such reaction. The condensed water generates undesirable bubbles upon pressing of the same, resulting in a deterioration of a dielectric characteristic of the material. A thermosetting resin having a thermal deformation temperature lower than about 200° C. is not preferable because it flows during pressing the resin substrates in a press to form a laminated unitary body of the multilayer printed circuit board.

Such an electroconductive wiring material as gold, silver, copper and tile like may be used for the signal interconnection layer 5. Copper is preferable because of its low cost and high conductivity. Material for the reinforcement lattice cloth may be of a metal or any electroconductive material. The electric conductivity of the reinforcement lattice cloth 1 need not be as large as those of metals and may be those of semiconductive materials. Practically, carbon fiber, polymer fibers such as polyacetylene fiber or a glass fiber with a metal deposited thereon may be employed.

As to a semi-conductive material, any of those having a specific resistance of, for example, $10^{-2}$ to $10^0$ $\Omega$-cm may be employed. The electroconductive reinforcement lattice cloth 1 is composed of rovings or strands constituted, For example, by bundles of plural copper solid wires each having a diameter of 8 $\mu$m. The diameter of each of the strands 1A is, for example, about 30 $\mu$m.

The lattice cloth is formed by providing the rovings 1A in the longitudinal and transversal directions perpendicularly to each other. The thickness of the portion of the resin layer 2 covering the lattice cloth 1 is about 20 $\mu$m and the total thickness of the prepreg 4 is about 100 $\mu$m. The electroconductive reinforcement lattice cloth 1 is not particularly limited in its mesh size. However, since the through-holes 3 pass within the meshes of the reinforcement lattice cloth 1, the mesh size should be well larger than the diameter of the through-holes 3 and should be integral multiples of the wiring pitch of the signal lines of the interconnection layer 5. For example, such a construction may be employed that the electroconductive reinforcement lattice cloth 1 has a mesh size of about 80 to 100 $\mu$m and the through-hole 3 has a diameter of 50 $\mu$m. The through-hole 3 is preferably formed by punching, but may be formed by a known photoresist patterning technology.

Figure 4:
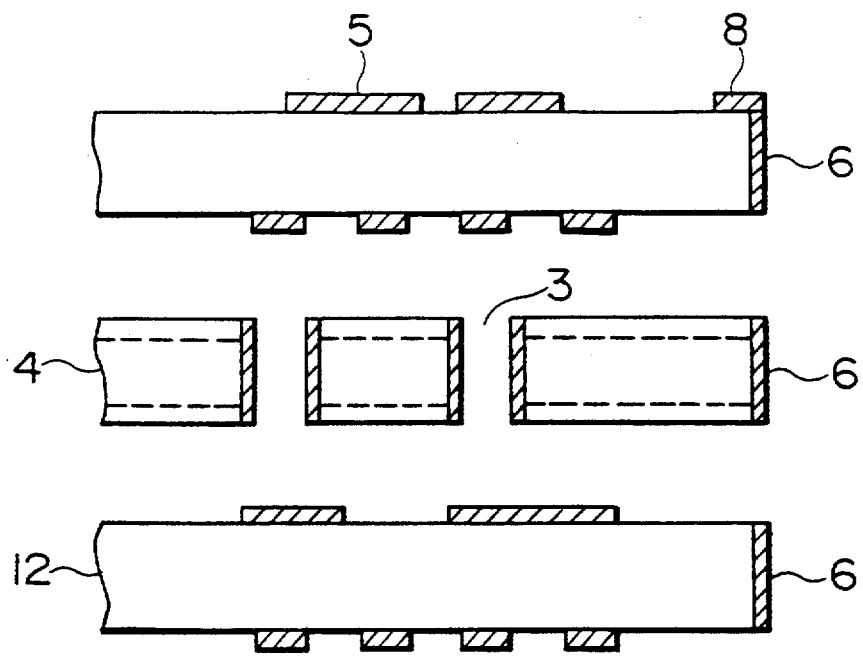
FIG. 4 is a developed cross-sectional view of the multilayer printed circuit board of FIG. 2 for showing an example in grounding the prepreg.

FIG. 4 is a developed cross-sectional view of the multilayer printed circuit board for showing an example in grounding the prepreg 4. In this example, the lattice cloth of the prepreg 4 is grounded by a ground layers 6 formed at the edges of the substrates 12 and prepreg 4. The ground layers 6 are connected to each other when the substrates 12 and the prepreg are formed in a laminated unitary body. The ground layer 6 is formed by, for example, a sputterring or a plating and connected to a grounding pad 8.

Figure 5:
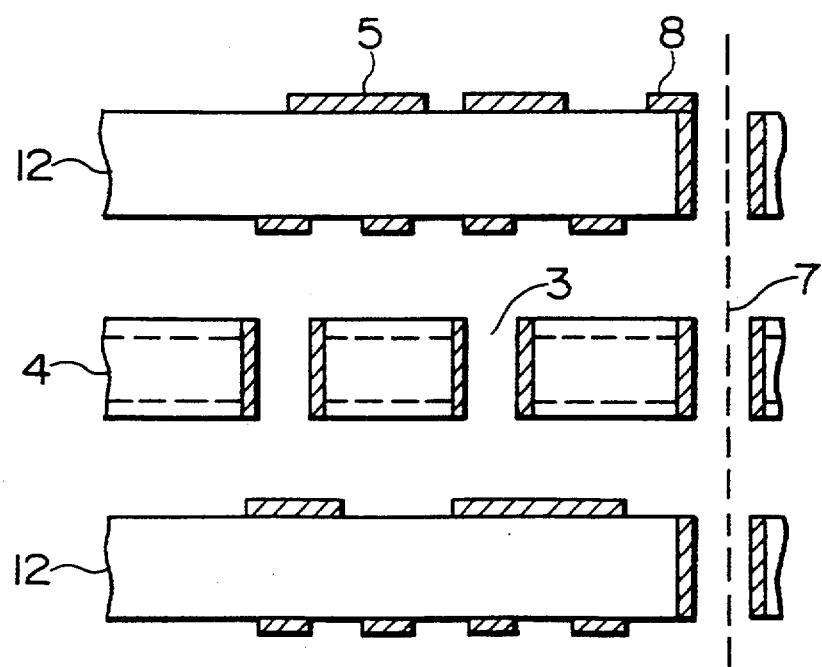
FIG. 5 is a developed cross-sectional view of a multilayer printed circuit board for showing another example in grounding the prepreg.

FIG. 5 is a developed cross-sectional view of the multilayer printed circuit board for showing another example in grounding the prepreg 4. In this example, the lattice cloth of the prepreg 4 is grounded by a through-hole 7 penetrating the substrates 12 and the prepreg 4. The through-hole 7 is connected to a grounding pad 8. The through hole 7 may be disposed at the intersection of the strands forming the lattice cloth, or disposed within the mesh of the lattice cloth.

With the embodiment as described above, since the heat resistant dielectric substrates 12 are integrally molded with tile prepreg 4, the electroconductive reinforcement lattice cloth 1 functions as a ground layer for the signal interconnection layers 5 and for the through-holes 3 through which these interconnection layers 5 are connected to each other, so that the cross-talk noises can be reduced in magnitude. Furthermore, the electroconductive reinforcement lattice cloth 1 functions as a reinforcement, for the multilayer printed circuit board, resulting in an improvement in heat resistance, dimensional stability, mechanical strength and other characteristics of the multilayer printed circuit board.

The multilayer printed circuit board of the present invention may be preferably employed particularly for a laminate printed board formed of plurality of printed substrates including a high frequency circuit. For example, it is preferably employed in a microwave transmission component, parabolic antenna and the like.

As described above, a multilayer printed circuit board according to the embodiment of the present invention employs a prepreg comprising a electroconductive lattice cloth impregnated with a heat resistant dielectric resin and having through-holes penetrating therethrough to thereby connect adjacent signal lines. The electroconductive lattice cloth functions both as a reinforcement for the printed circuit board and as a ground layer between the signal interconnection layers and between the through-holes through which the interconnection layers are connected. Consequently, a cross-talk noise can be reduced in magnitude, and heat resistance, dimensional stability, mechanical strength and other properties can be effectively improved.

Since above embodiments are described only for example, the present invention is not limited to such embodiments and it will be obvious for those skilled in the art that various modifications or alterations can be easily made based on the above embodiments within the scope of the present invention.

What is claimed is:

1. A multilayer printed circuit board comprising:
  a first and a second dielectric substrates each having at least one interconnection layer formed on a surface thereof; and
  a third dielectric substrate sandwiched between said first and second dielectric substrates and integrally molded with said first and second dielectric substrates to form a unitary body of said substrates, said third dielectric substrate being composed of an electroconductive reinforcement lattice cloth maintained at a certain potential and a dielectric resin impregnated in and covering said reinforcement lattice cloth, said electroconductive reinforcement lattice cloth comprising intermeshed conductive rovings defining interstices therebetween, said dielectric resin forming a dielectric solid layer having through-holes penetrating therethrough within aid interstices of said electroconductive reinforcement lattice cloth to thereby provide an electrical connection between said interconnection layers of said first and second dielectric substrates.

2. The multilayer printed circuit board as defined in claim 1, wherein said dielectric resin includes a thermosetting resin having a thermal deformation temperature not lower than about 200° C.

3. The multilayer printed circuit board as defined in claim 1, wherein said electroconductive reinforcement lattices cloth has a specific resistance ranging from $10^{-2}$ to $10^0$ $\Omega$-cm.

4. The multilayer printed circuit board as defined in claim 3, wherein said electroconductive reinforcement lattice cloth comprises carbon fiber.

5. The multilayer printed circuit board as defined in claim 1, wherein said electroconductive reinforcement lattice cloth is composed of rovings made of a plurality of solid metal wires.

6. The multilayer printed circuit board as defined in claim 1, wherein said electroconductive reinforcement lattice cloth has a mesh size equal to integral multiples of the pitch of signal lines of said interconnection layers.

7. The multilayer printed circuit board as defined in claim 1, wherein said electroconductive reinforcement lattice cloth has a mesh size ranging from 80 to 100 $\mu$m.

8. The multilayer printed circuit board as defined in claim 1, wherein said certain potential is a ground potential, whereby said electroconductive reinforcement lattice cloth 1 functions as a ground layer for said interconnection layers of said first and second dielectric substrates, thereby reducing cross-talk noise between said first and second interconnection layers and adjacent ones of said through-holes.

* * * * *